United States Patent
Yagi (10) Patent No.: US 8,673,664 B2
(45) Date of Patent: Mar. 18, 2014

(54) METHOD OF MANUFACTURING PHOTODIODE WITH WAVEGUIDE STRUCTURE AND PHOTODIODE

(75) Inventor: Hideki Yagi, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 13/534,057

(22) Filed: Jun. 27, 2012

(65) Prior Publication Data

US 2013/0001643 A1    Jan. 3, 2013

(30) Foreign Application Priority Data

Jul. 1, 2011   (JP) ................................ 2011-147654

(51) Int. Cl.
*H01L 21/00*    (2006.01)

(52) U.S. Cl.
USPC ............................................. 438/31; 385/14

(58) Field of Classification Search
USPC ............ 438/22, 24, 31, 46, 47; 257/E31.055; 385/14
See application file for complete search history.

(56) References Cited

U.S. PATENT DOCUMENTS

6,710,378 B1    3/2004   Makiuchi

*Primary Examiner* — Shaun Campbell
(74) *Attorney, Agent, or Firm* — Smith, Gambrell & Russell, LLP (57) ABSTRACT

A process to form a photodiode (PD) with the waveguide structure is disclosed. The PD processes thereby reduces a scattering of the parasitic resistance thereof. The process includes steps to form a PD mesa stripe, to bury the PD mesa stripe by the waveguide region, to etch the PD mesa stripe and the waveguide region to form the waveguide mesa stripe. In the etching, the lower contact layer plays a role of the etching stopper.

8 Claims, 10 Drawing Sheets

METHOD OF MANUFACTURING PHOTODIODE WITH WAVEGUIDE STRUCTURE AND PHOTODIODE

BACKGROUND OF THE INVENTION

1. Field of the Invention

The present invention relates to a method of manufacturing a semiconductor photodiode (hereafter denoted as PD), in particular, a PD with a waveguide structure.

2. Related Prior Arts

A photodiode with a waveguide structure has been disclosed in the U.S. Pat. No. 6,710,378. The PD disclosed therein has formed the optical waveguide independent of an optically active region for the PD, and the PD is optically coupled with the waveguide by, what is called, the butt-joint. Conventional PDs with the waveguide structure often show that the parasitic resistance thereof is widely scattered primarily due to the stacking sequence of the semiconductor layers in the butt-joint. A PD according to an embodiment of the invention may solve such a subject.

SUMMARY OF THE INVENTION

One aspect of an embodiment relates to a method to manufacture a PD with the waveguide structure. The method may include steps of: (a) preparing a pin structure by growing the p-type contact layer, the i-type absorption layer, and the n-type cladding layer on the semi-insulating semiconductor substrate; (b) etching a portion of the pin structure fro form a mesa stripe extending along the first direction; (c) burying the mesa stripe by a waveguide region including the lower cladding region, the core region, and the upper cladding region each selectively grown on the primary surface of the semiconductor substrate, where the lower cladding region abuts against a side of the p-type contact layer, the core region abuts against a side of the i-type absorption layer, and the n-type cladding layer abuts against the n-type cladding layer; (d) etching a portion of the lower cladding region, the core region, and the upper cladding region concurrently with an etching of the i-type absorption layer and the n-type cladding layer by the p-type contact layer as an etching stopper layer, wherein the second etching forms a waveguide mesa and the active mesa, the waveguide mesa extending along the second direction substantially in perpendicular to the first direction, the active mesa including the p-type contact layer, the i-type absorption layer, and the n-type cladding layer; and (e) forming an electrode on the active mesa and another electrode on the p-type contact layer. A feature of the method of the embodiment is that the p-type contact layer contains aluminum (Al).

While, the waveguide regions and layers except for the p-type contact layer are free from Al, or even when those regions and layers contain Al, the compositions thereof is far less than the composition of Al in the p-type contact layer. Thus, the p-type contact layer may show the etching rate far less than etching rates for other regions and layers. Accordingly, the p-type contact layer is substantially invariant in a thickness thereof even when the p-type contact layer is exposed in plasma during the etching to form the waveguide mesa and the active mesa.

Another aspect of an embodiment of the present invention relates to an arrangement of the PD with the waveguide structure. The PD may include a semiconductor substrate with a semi-insulating characteristic, an active mesa, a waveguide mesa, a burying region, and an electrode. The active mesa includes a p-type contact layer containing Al, an i-type absorption layer, and an n-type cladding layer, where they may be stacked in this order on the substrate. The waveguide mesa, which includes a lower cladding region, a core region, and an upper cladding region, continues from the active mesa. The waveguide mesa may inject photons into the i-type absorption layer in the active mesa. The burying region, which may be made of resin, buries the active mesa and the waveguide mesa. The electrode is in contact with the top of the active mesa, and the p-type contact layer. A feature of the arrangement of the PD is that the p-type contact layer contains Al and has a substantially even thickness in a portion in the active mesa and another portion below the burying region.

Because the p-type contact layer contains Al, but another layers and regions are free from Al, or even when the other layers and regions contains Al, the compositions thereof are far less than the composition of Al in the p-type contact layer. Because the p-type contact layer and other layers and regions are thus configured, the p-type contact layer may be operable as the etching stopper layer for the etching to form the active mesa and the waveguide mesa, which makes the thickness of the p-type contact layer substantially invariant, accordingly, parasitic resistance attributed to the p-type contact layer may be suppressed in scattering thereof.

BRIEF DESCRIPTION OF THE DRAWINGS

The foregoing and other purposes, aspects and advantages will be better understood from the following detailed description of a preferred embodiment of the invention with reference to the drawings, in which:

FIG. 14A is a perspective view showing a cross section of the waveguide region, while.

DETAILED DESCRIPTION OF PREFERRED EMBODIMENTS

Next, some preferred embodiments according to the present invention will be described as referring to the drawings. In the description of the drawings, numerals or symbols same or similar to each other will refer to elements same or similar to each other without overlapping explanations. Aspect ratios of elements and spaces between elements in the drawings are set only for the explanation sake, and do not always reflect their original dimensions.

The method according to an embodiment of the invention primarily comprises of processes to stack semiconductor layers, to form a mesa, to form a waveguide, to prepare the second mask, to etch semiconductors, to form a burying region, and to form electrodes. Next, respective processes will be explained in detail.

(Stacking Semiconductor Layers)

Figure 1:
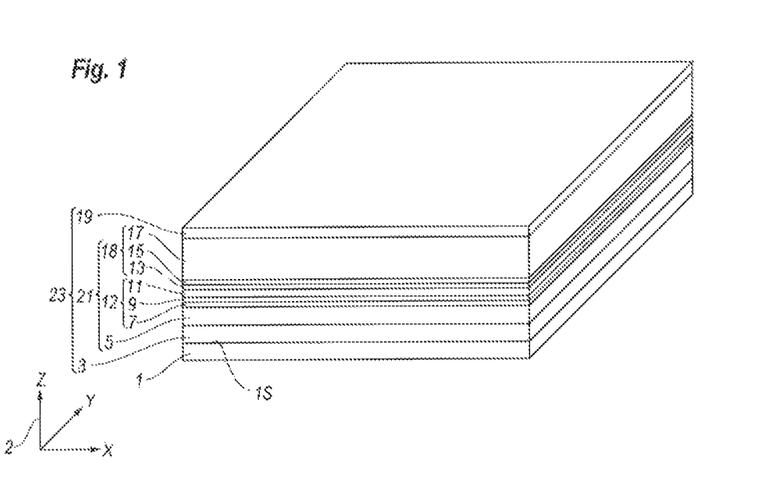
FIG. 1 is a perspective view of a stack of semiconductor layers for a device according to an embodiment of the invention.

The process first grows semiconductor layers on a primary surface of a semiconductor substrate. FIG. 1 is a perspective view showing the process to stack semiconductor layers. As shown in FIG. 1, the process sequentially grows, on the primary surface 1S of the substrate 1, a buffer layer 3, a lower contact layer 5, a first intermediate layer 7, a second intermediate layer 9, an absorption layer 11, a third intermediate layer 13, a fourth intermediate layer 15, a cladding layer 17, and an upper contact layer 19 in this order by. These layers, 3 to 10, constitutes the stack 23 provided on the primary surface 1S of the substrate 1. The drawings in this specification assume that the X- and Y-directions are parallel to the primary surface 1S of the substrate, while, the Z-direction is in perpendicular to the surface 1S.

The semiconductor substrate 1 may be made of semi-insulating semiconductor material, such as iron (Fe) doped InP, because the semi-insulating substrate is preferable to reduce parasitic capacitance. The buffer layer 3 may be made of, for instance, intrinsic i-type InP, where a context "intrinsic" means that a semiconductor material is un-intentionally doped with impurities and generally shows the impurity concentration less than $1 \times 10^{16}$ cm$^{-3}$. The lower contact layer 5 may be made of p-type AlInAs preferably having a thickness of 0.5 μm but less than 1.0 μm. The first and second intermediate layers, 7 and 9, where they are put between the lower contact layer 5 and the absorption layer 11, may be made of i-GaInAsP.

The absorption layer 11 may be made of i-GaInAs. The third and fourth intermediate layers, 13 and 15, where they are put between the absorption layer 11 and the cladding layer 17, may be made of n-type GaInAsP. The cladding layer 17 may be made of n-type InP, while, the upper contact layer 19 may be made of n-type GaInAs.

Thus, the stack 23 may be made by the group III-V compound semiconductor materials and contains a p-i-n structure (hereafter denoted as pin) 21 for the pin-PD. In the present embodiment shown in FIG. 1, the lower contact layer 5 operates as the p-type layer of a pin-PD, the first and second intermediate layers, 7 and 9, and the absorption layer 11 constitute the i-type layer 12 of a pin-PD, and the third and the fourth intermediate layers, 13 and 15, and the cladding layer 17 constitute the n-type layer 18 of the pin-PD. That is, the lower contact layer 5, the i-type layer 12, and the n-type layer 18 constitute the pin structure 21; while, the buffer layer 3, the pin structure 21, and the upper contact layer 19 constitute the stack 23.

The absorption layer 11 may generate carriers, namely, electrons and holes, by absorbing photons. The lower contact layer 5 provides functions not only to secure the ohmic contact to the anode electrode but operate as an etching stopper. The cladding layer 17 operates as the upper cladding layer. The bandgap energy of layers from the lower contact layer 5 to the cladding layer 7 show specific relations to each other.

Figure 2:
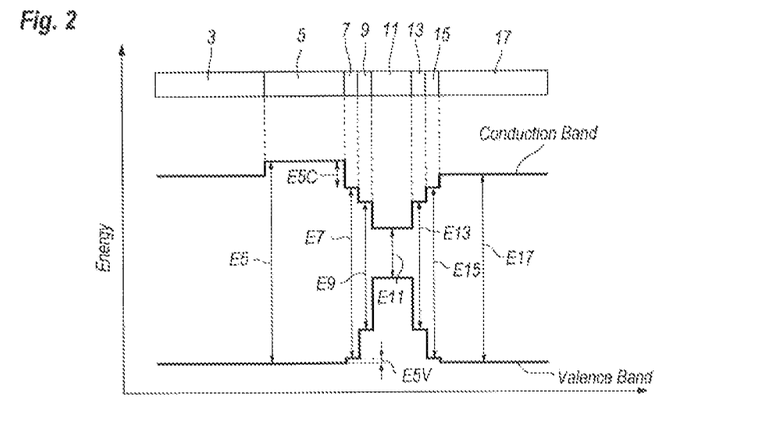
FIG. 2 schematically shows the band diagram of the PD according to an embodiment of the invention.

FIG. 2 schematically illustrates the bandgap diagram of the layers from the buffer layer 3 to the cladding layer 17. The bandgap energy E7 of the first intermediate layer 7 is less than that E5 of the lower cladding layer 5 but greater than that E11 of the absorption layer 11. The bandgap energy E9 of the second intermediate layer 9 is less than that E7 of the first intermediate layer E7 but greater than that E11 of the absorption layer 11.

Because of the existence of the first and second intermediate layers, 7 and 9, the bottom of the conduction band rises in stepwise from the absorption layer 11 to the lower contact layer 5. On the other hand, the first and second intermediate layers, 7 and 9, may fall the top of the valence band in stepwise from the absorption layer 11 to the lower contact layer 5.

The band diagram described above, that is, the bottom of the conduction band rises in stepwise, while the top of the valence band falls in stepwise each from the lower contact layer 5 to the absorption layer 11 may be realized by adjusting the composition of semiconductor materials. For instance, the lower contact layer 5, the first and second intermediate layers, 7 and 9, and the absorption layer 11 may be arranged to have respective bandgap wavelengths of, 860 nm, 1150 nm, 1300 nm, and 1670 nm.

Moreover, when AlInAs layer comes in contact with GaInAsP layer, a band offset between the valence bands thereof becomes smaller compares with a band offset between the conduction bands. Accordingly, the band offset E5V of the valence band between AlInAs contact layer 5 and GaInAsP first intermediate layer 7 becomes less to than the band offset E5C of the conduction band between the two layers, 5 and 7. While, the refractive index of respective layers, 5 to 11, show an interrelation opposite to that of the bandgap energy. That is, the absorption layer 11 has the largest refractive index among the layers, 5 to 11, and reduces in stepwise to the lower contact layer 7.

As for the layers from the absorption layer 11 to the cladding layer 17, the bandgap energy E15 of the fourth intermediate layer 15 is less than that E11 of the cladding layer 17 but greater than that E11 of the absorption layer 11. The bandgap energy E13 of the third intermediate layer 13 is less than that E15 of the fourth intermediate layer 15 but greater than that E11 of the absorption layer 11.

Thus, the third and fourth intermediate layers, 13 and 15, make the bottom of the conduction band to rise in stepwise from the absorption layer 11 to the cladding layer 17. The third and fourth intermediate layers, 13 and 15, also make the top of the valence band to fall in stepwise from the absorption layer 11 to the cladding layer 17. In order to realize such bandgap profile to rise or fall in stepwise from the absorption layer 11 to the cladding layer 17, the composition of respective layers, 11 to 17, are necessary to be adjusted. For instance, the bandgap wavelengths from the absorption layer 11 to the cladding layer 17 are set to be 1670 nm, 1300 nm, 1150 nm, and 920 nm, respectively.

As for the refractive index of layers, 11 to 17, the interrelation opposite to those of the band diagram may be set. That is, the refractive index is the highest in the absorption layer 11, to decreases in stepwise to the cladding layer 17, and becomes smallest thereat.

(Forming Mesa)

Figure 3:
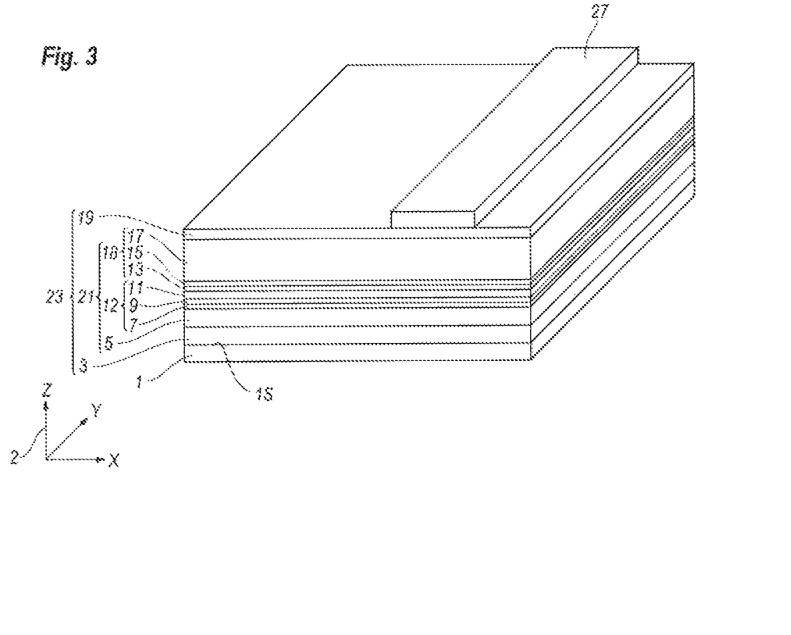
FIG. 3 is a perspective view showing a process to form a mesa.
Figure 4:
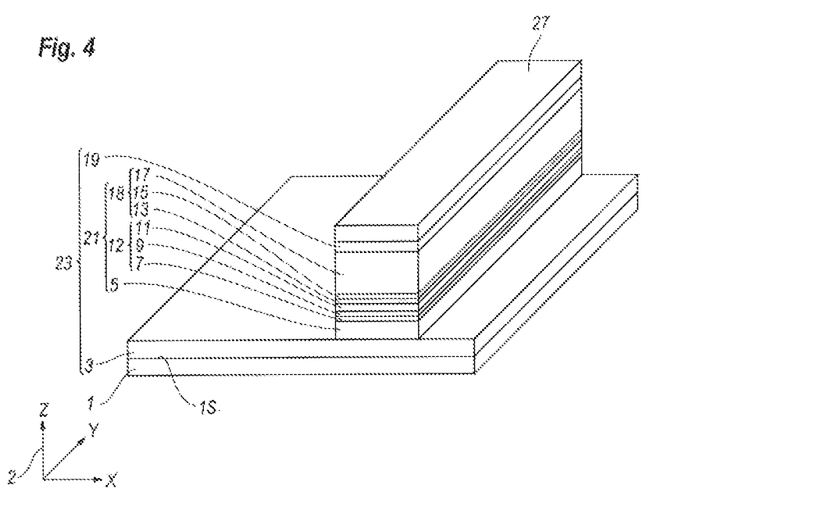
FIG. 4 is a perspective view showing a process, subsequent to that, shown in FIG. 3, to form a mesa.

The process next forms a mesa stripe. FIGS. 3 and 4 are perspective views showing respective processes to form the mesa stripe. As shown in FIG. 3, the first mask 27 is prepared on the top of the stack 23. The first mask 27, which may be made of inorganic material such as SiN with a thickness of about 200 nm and extends in Y-direction, covers a portion of the top of the stack 23. The first mask 27 is prepared for forming a butt-joint, which will be described later.

The first mask 27 may be formed as follows: the conventional technique such as the chemical vapor deposition (CVD) deposits an inorganic film made of silicon nitride (SiN) on a whole surface of the stack 23, then, it is processed to a predetermined pattern by a conventional photolithography.

The process removes a portion of the stack 23 by, for instance, the wet etching using the first mask 27. The etching may remove a portion of the stack 23 exposed from the first mask 27. Thus, a mesa stripe 31 may be formed along Y-direction. The present embodiment includes the pin structure 21 by the lower contact layer 5, the i-type layer 12, the n-type cladding layer 18, and the upper contact layer 19 within the mesa stripe 31.

The buffer layer 3 is preferably to be an etching stopper layer for the process to form the mesa stripe 31. That is, the etching to form the mesa stripe 31 is preferably to be carried out under conditions where the etching rate for the lower contact layer 5 is to larger than that of the buffer layer 3. For instance, a mixture of sulfuric acid ($H_2SO_4$) with hydrogen peroxide ($H_2O_2$) or another mixture of hydrochloric acid (HCl) with hydrogen peroxide is preferable for the buffer layer 3 to operate as the etching stopper.

(Forming Waveguide)

Figure 5:
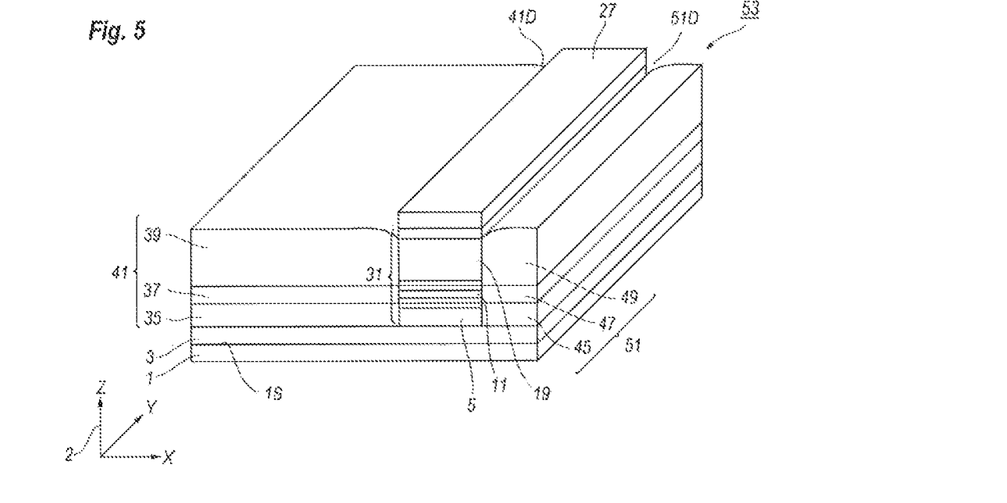
FIG. 5 is a perspective view showing a process to form a waveguide.

The process next forms the waveguide. FIG. 5 is a perspective view showing the process to form the waveguide. In the present process, regions, 41 and 51, are formed in both sides of the mesa 31 by using the first mask 27 such that the regions, 41 and 51, come in contact with, or abut against the side of the mesa stripe 31 without any gaps therebetween. Further specifically, the metal organic vapor phase epitaxy (MOVPE) technique may selectively grow the waveguide regions, 41 and 51, by the first mask 27. Because the first mask 27 is used in both processes to form the mesa stripe 31 and to bury the mesa stripe 31, the waveguide regions, 41 and 51, may be easily arranged.

The waveguide region 41 includes the lower cladding region 35, the core region 37, and the upper cladding region 39 in this order stacked on the buffer layer 3. The lower and upper cladding regions, 35 and 39, may be made of i-type InP, while, the core region 37 may be made of i-type GaInAsP. The waveguide region 41, namely, the lower and upper cladding regions, 35 and 39, and the core region 37, are preferably free from aluminum (Al), or even when the waveguide region 41 is not free from Al, the composition thereof is far less than that of the lower contact layer 5, which may operate the lower contact layer 5 as an etching stopper layer. In the present embodiment, the lower cladding region 35 is in contact with a side of the lower contact layer 5, the core region 37 is in contact with the side of the absorption layer 11, and the upper cladding region 39 is in contact with the side of the upper contact layer 19.

Similarly, the other waveguide region 51 includes the lower cladding region 45, the core region 47, and the upper cladding region 49. The lower and upper cladding regions, 45 and 49, may be made of i-type InP, while, the core region 47 may be made of i-type GaInAsP. Also, these regions, 45 to 49, is preferably free from Al, or even when the regions, 45 to 49, contain Al, the compositions thereof is far less than that of the lower contact layer 5 in order to realize the etching stopper function by the lower contact layer 5. The lower cladding region 45 is in contact with the side of the lower contact layer 5, the core region 47 is in contact with the side of the absorption layer, and the upper cladding region 49 is in contact with the upper contact layer 19.

In the selective growth of the waveguide regions, 41 and 51, by using the first mask 27, the growth rate becomes slower in a portion close to the first mask 27, which sometimes causes depressions, 41D and 51D, adjacent to the first mask 27. The depressions, 41D and 51D, degrade the flatness of the top surface 53 and influence the quality of subsequent processes. For instance, the second mask to be prepared on the surface of the upper cladding layer 39 induces failures or easily peeled off.

Figure 6:
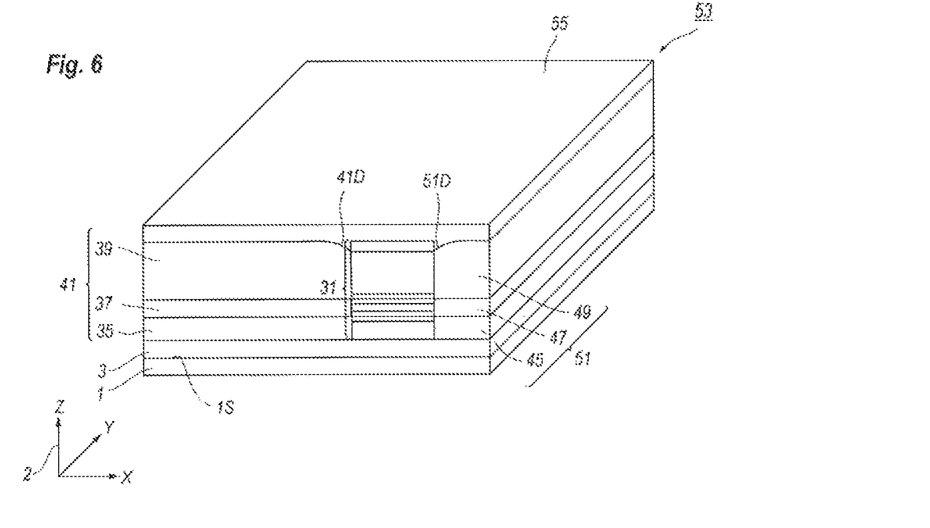
FIG. 6 is a perspective view showing a process to form a cap layer.

A cap layer 55 formed on the upper cladding layer 55 may compensate the depressions, 41D and 51D. FIG. 6 is a perspective view showing a process to form the cap layer 55. Removing the first mask 27, the cap layer 55 may be grown to cover the whole surface to of the mesa stripe 31 and the upper cladding layers, 39 and 49, by MOVPE technique. The cap layer 55 may be made of i-type InP. The cap layer 55 may recover the flatness of the top surface. The flatness of the top surface of the cap layer 55 is superior to that of the mesa stripe 31 and the upper cladding regions, 39 and 49.

(Preparing the Second Mask)

Figure 7:
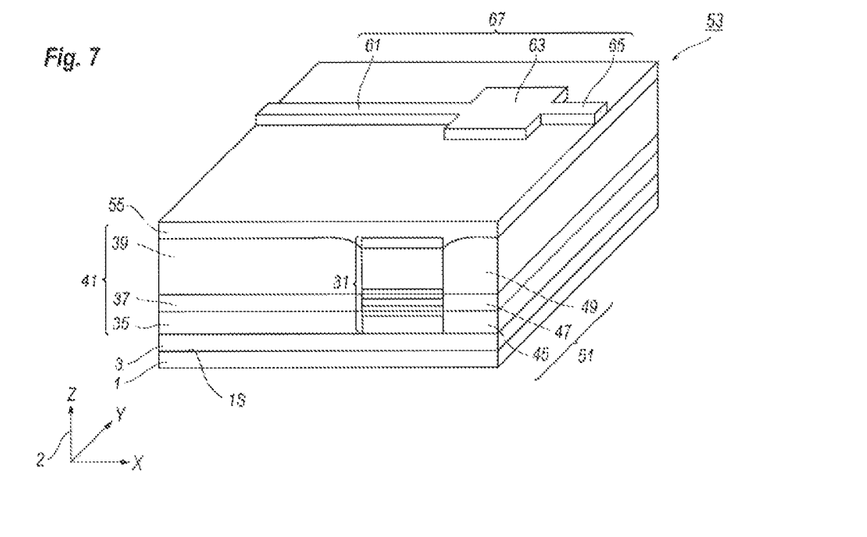
FIG. 7 is a perspective view showing a process to prepare the second mask.

The process next prepares the second mask. FIG. 7 is a perspective view showing a process to form the second mask 67. The second mask 67 extends along X-direction on the top surface of the intermediate product 53. The second mask 67, which may be also made of inorganic material, typically, silicon nitride (SiN), includes the first portion 61 covering a portion of the waveguide region 41, the second portion 63 covering the mesa stripe 31, and the third portion 65 covering the other waveguide region 51. These three portions, 61 to 63, continue along X-direction. A feature of the second mask 67 is that a width of the second portion 63 is wider than a width of the first portion 61 and that of the third portion 65. The second mask 67 may have a thickness of about 300 nm. The second mask 67, similar to the first mask 27, may be formed by conventional CVD technique and subsequent photolithography.

(Etching Semiconductor Product)

Figure 8:
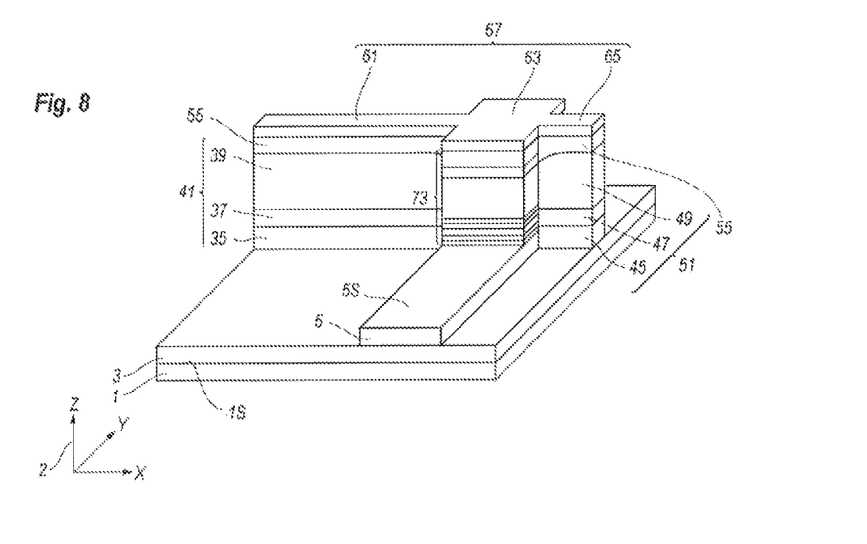
FIG. 8 is a perspective view showing a process to form the waveguide.
Figure 9:
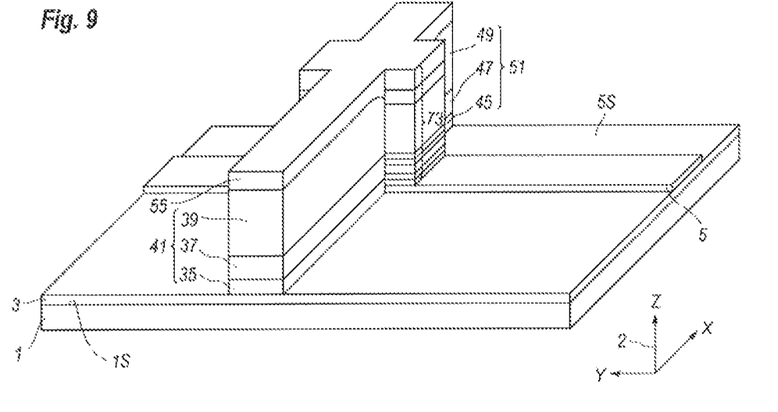
FIG. 9 is a perspective view showing a process to form the waveguide, where the waveguide is viewed from a direction different from that of FIG. 8.

The process next performs the etching of the semiconductor structure. FIGS. 8 and 9 are perspective views showing processes to etch the intermediate product 53. The etching process etches the mesa stripe 31 and the waveguide regions, 41 and 51, by using the second mask 67 and the contact lower layer 5 as an etching stopper.

Specifically, the mesa stripe 31 may be etched to expose a top 5S of the lower contact layer 5 under the second mask 63 and leave the active mesa 73 including the layers from the first intermediate layer 7 to the cap layer 55. The etching for the waveguide regions, 41 and 51, may expose the buffer layer 3 in regions not covered by the second mask, 61 and 65, to leave the waveguide mesa therein. The waveguide mesa extends in X-direction.

The etching for the waveguide regions, 41 and 51, and the mesa stripe 31 are carried out by the lower contact layer 5 as an etching stopper layer. That is, a condition where the etching rate for the lower contact layer 5 becomes smaller than that for layers involved in the mesa 31, that is, i-type layer 12, and n-type layer 17, and two waveguide regions, 41 and 51.

The selective etching may suppress the thinning of the lower contact layer 5, in other words, the lower contact layer 5 left by the etching may be easily controlled in a thickness thereof, and the parasitic resistance attributed to the lower contact layer 5 may reduce the scattering thereof.

Well known dry etching techniques, such as plasma reactive ion etching using the parallel plate electrodes or the inductive coupled plasma (hereafter denoted as ICP) etching, may be used for forming the mesa. The ICP etching is preferable because the ICP etching may lower the bias voltage during the etching compared with the apparatus of the type of the parallel plate, which the ICP etching may lower the etching rate for the lower contact layer 5 relative to the other layers, and the etching ratio for the lower contact layer 5 becomes large. The etching ratio is given by a ratio of the etching rate of the lower contact layer 5 with respect to those of the other layers, and it means how the lower contact layer 5 is hard to be etched. Thus, the ICP etching may precisely control the thickness of the lower contact layer 5 and reduce the scattering in a thickness thereof; accordingly, the PD 100 with the waveguide type shows the parasitic resistance within a superior scattering thereof.

The ICP etching may apply, as etching gases, a mixture of methane ($CH_4$) and hydrogen ($H_2$) in a ratio of 1:3, a pressure of 2 Pa, a bias power greater than 0 $W/cm^2$ but smaller than 1 $W/cm^2$, or preferably greater than 0.3 $W/cm^2$ less than 0.6 $W/cm^2$, and the ICP power of 4.4 $W/cm^2$. Those conditions optionally depend on the dimensions of the apparatus, the reaction temperature, and so on.

The lower contact layer 5 may have aluminum (Al) composition from 50 to 70%, when RIE etching is applied to form the mesa. The lower contact layer 5, when the Al composition thereof is greater than 50%, may lower the etching rate thereof compared with the etching rate for layers above the lower contact layer 5 in the mesa stripe 31 and the layers constituting the waveguide regions, 41 and 51, which may reduce the scattering in the parasitic resistance of the PD. While, the lower contact layer 5 with Al composition less than 70% may secure the crystal quality of not only the lower contact layer 5 but the layers thereabove.

The process subsequently removes the second mask 67 by a wet etching using a buffered hydrofluoric acid. Thus, the mesa stripe 31 is removed to expose the lower contact layer 5 provided thereunder, and the waveguide mesas, 41 and 51, are formed in stripe extending along the X-direction.

Figure 10:
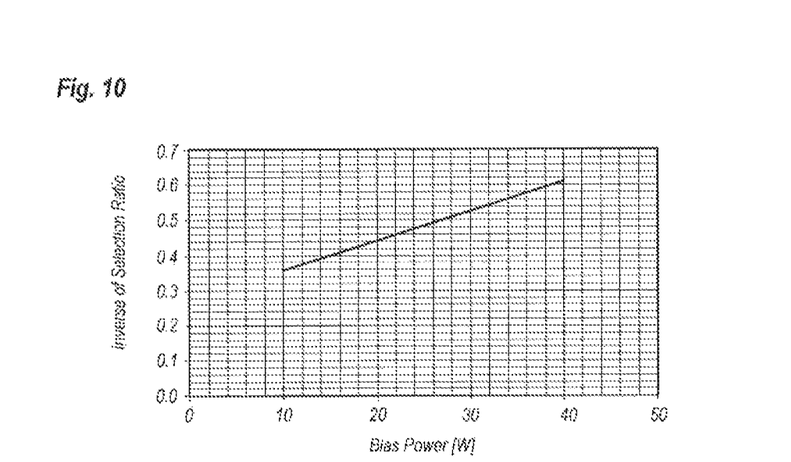
FIG. 10 shows an experimental result of an etching selectivity, which is an inverse of an etching rate of a lower contact layer to an etching rate of layers stacked above the lower contact layer.

The ICP etching for materials of AlInAs and InP was further to investigated. FIG. 10 shows the etching ratio of InP to AlInAs against the bias power in the ICP etching. During the investigation, the etching rate of InP and that of AlInAs were measured under the same condition of the ICP etching, and the etching ratio indicated in the vertical axis was derived from the etching rate of InP divided by that of AlInAs. The measurement only changed the bias power but kept other conditions, such as the mixture ratio of $CH_4$ to $H_2$, the pressure, the ICP power, and so on.

The vertical axis in FIG. 10 corresponds to a reciprocal number of the etching ratio, while, the horizontal axis shows the bias power. From results shown in FIG. 10, the etching ratio of AlInAs against InP increases as the bias power increases, that is, the AlInAs becomes hard to be etched against InP in the ICP etching as the bias power of the ICP etching increases.

(Forming a Burying Region)

Figure 11:
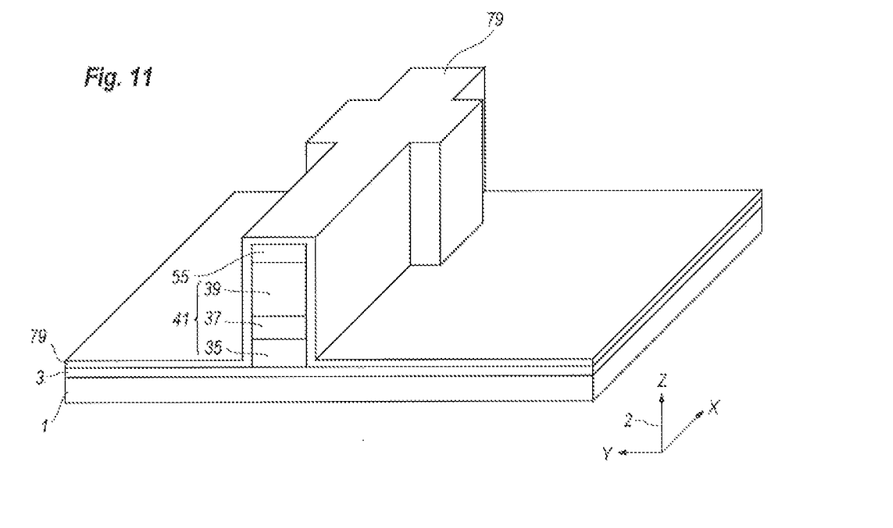
FIG. 11 is a perspective view showing a process to form a protection layer.
Figure 12:
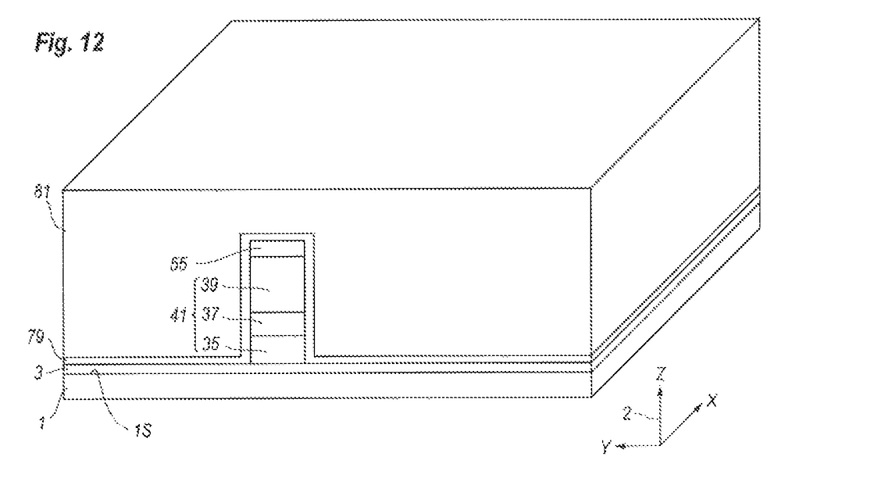
FIG. 12 is a perspective view showing a process to form the burying region on the protection layer.

The process next buries the structures thus formed. FIGS. 11 and 12 show processes to bury the structure. As shown in FIG. 11, a protection layer 79, which may be made of inorganic material typically silicon oxide ($SiO_2$) formed by the CVD method, covers all exposed portions of the layers, namely, the buffer layer 3, the waveguide regions, 41 and 51, the active mesa 73, the lower contact layer 5, and the cap layer 55. Formed on the protection layer 79 is a burying region 81 as shown in FIG. 12. The structures, which include the active mesa 73 and the lower contact layer 5, and two waveguide regions, 41 and 51, are buried by the burying region 81. The burying region may be made of resin, for instance, benzo-cycro-butenes (BCB).

(Forming Electrodes)

Figure 13:
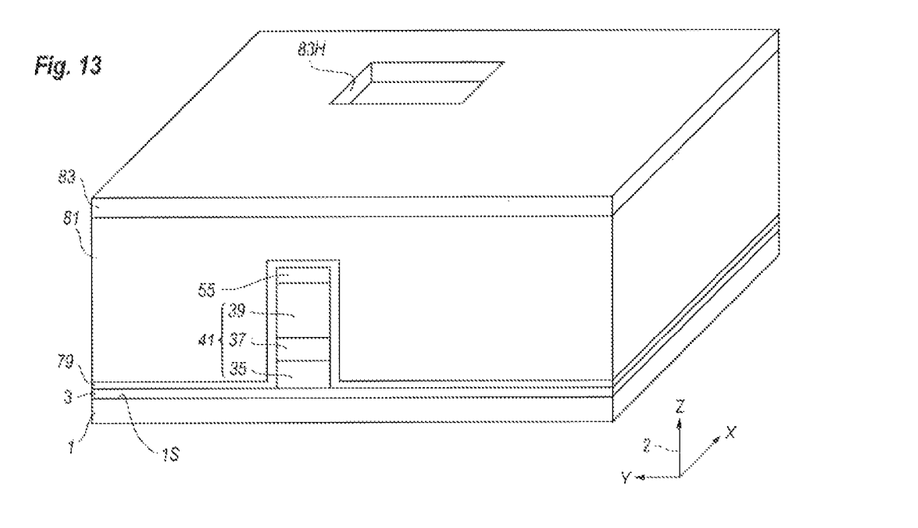
FIG. 13 is a perspective view showing a process to prepare the second mask for an electrode.
Figure 18A:
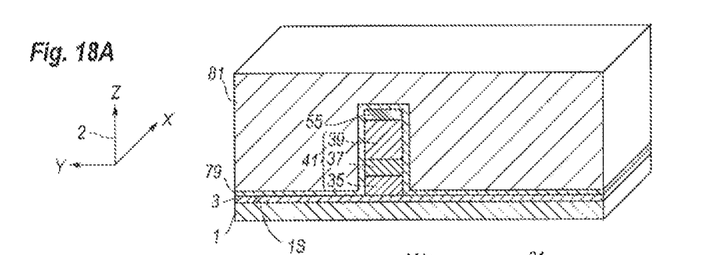
FIG. 18A is a perspective view showing a process to form the electrode, where the waveguide region is still covered by the burying region.
Figure 18B:
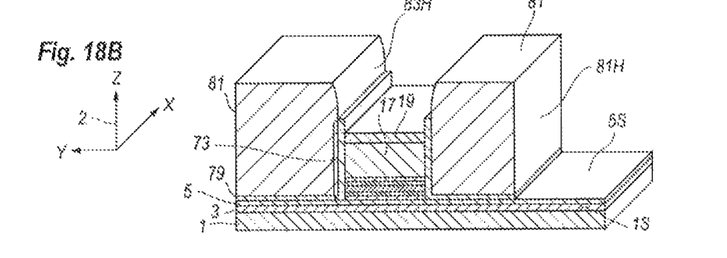
FIG. 18B is a perspective view showing a process to etch the cap layer on the active mesa.
Figure 19:
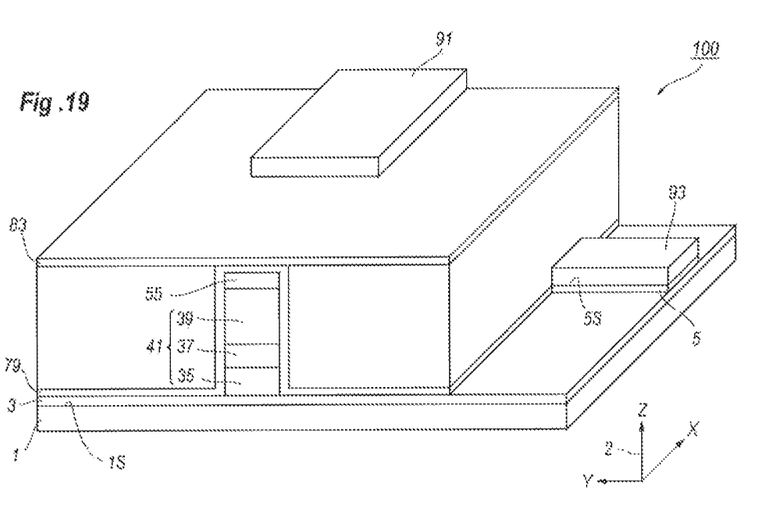
FIG. 19 is a perspective view showing a process to form the electrodes on the active mesa and the lower contact layer.

The process next forms electrodes. FIGS. 13 to 10 show processes to form electrodes, where FIGS. 13 and 19 are perspective views, while, FIGS. 14 to 18 are partially cross sectional views.

Figure 14A:
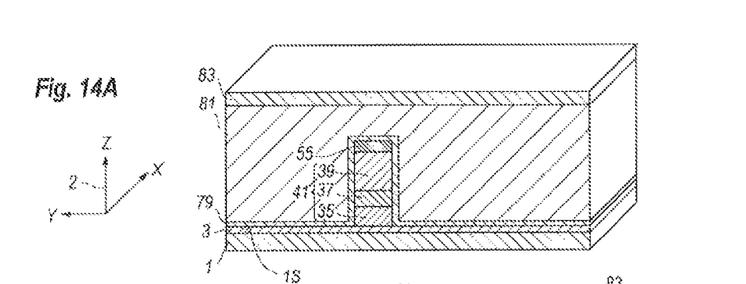

As shown in FIG. 13, depositing a photoresist 83 on the burying region 81, an ordinal photolithography forms an opening 83H in the photoresist 83. In FIG. 13 or FIG. 14A, the waveguide region 41 is shown by a cross section thereof, while, the active mesa 73 is shown in the cross section thereof taken along the Y-direction. The drawings of FIGS. 15A, 16A, 17A, 18A and 19A correspond to FIG. 14A, while FIGS. 15B, 16B, 17B, 18B, and 19B correspond to FIG. 14B.

Figure 14B:
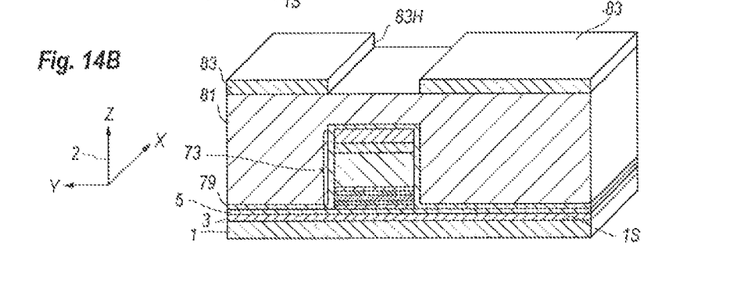
FIG. 14B is a perspective view showing a cross section of the PD region.
Figure 15A:
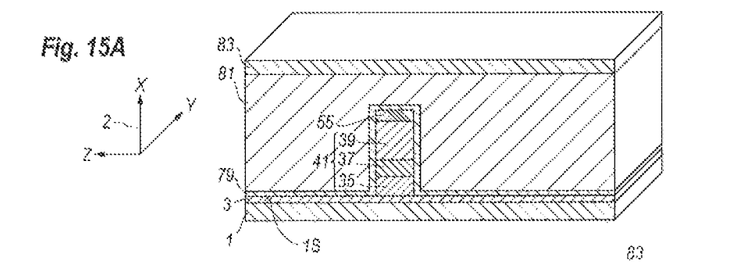
FIG. 15A is a perspective view showing a process to form an electrode, where the waveguide region is partially cut to show a cross section thereof.
Figure 15B:
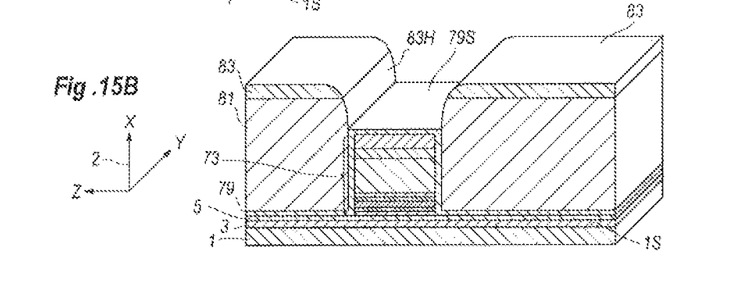
FIG. 15B is a perspective view showing a process to form an electrode on the active mesa.

The opening 83H is formed above the active mesa 73, and does not exist in the waveguide regions, 41 and 51, as shown in FIGS. 14A and 14B. Then, the reactive ion etching (RIE) using a mixture of $CH_4$ and oxygen ($O_2$) may etch the burying region 81 exposed in the opening 83H by the photoresist 83 as the etching mask to reveal the top 79S of the protection layer 79 on the active mesa 73. Because the photoresist 83 covers the waveguide regions, 41 and 51, the burying region 81 in portions above the waveguide regions, 41 and 51, may be not etched.

Figures 16A, 16B:
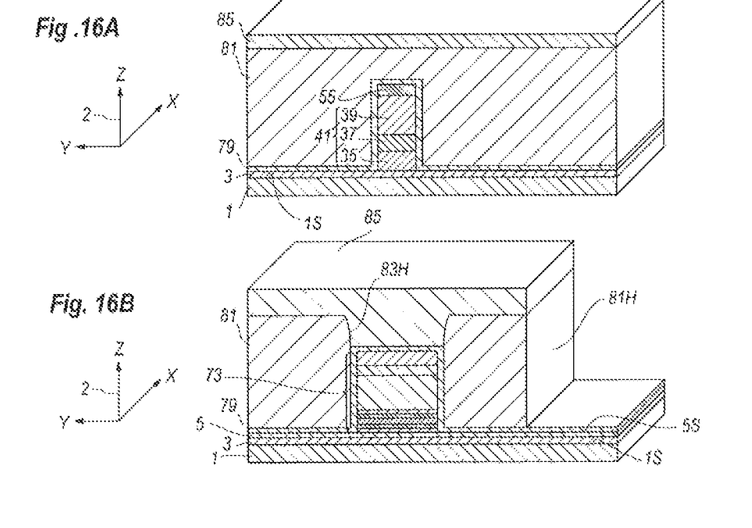
FIG. 16A is a perspective view showing a process to form an electrode, where the waveguide region is still covered by another mask.
FIG. 16B is a perspective view showing a process to remove the waveguide region to form an electrode there.

Removing the photoresist 83, coating another photoresist 85 to cover the active mesa 73 and the burying region 81, the photolithography technique makes an opening in an area corresponding to the top 5S of the lower contact layer 5 which is exposed by the active mesa forming process. The RIE etching using a mixture of $CH_4$ and $O_2$ may etch the burying region 81 by the patterned photoresist 85 as an etching mask to form an opening 81H as shown in FIG. 16B. The opening 81H may expose the protection layer 79 on the top 5S of the lower contact layer 5.

Figure 17A:
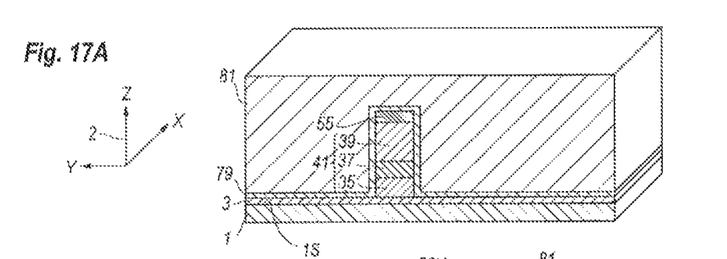
FIG. 17A is a perspective view showing a process to form an electrode, where the waveguide region is covered by the mask.
Figure 17B:
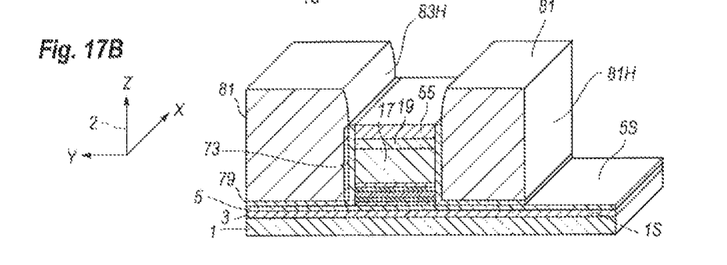
FIG. 17B is a process to etch the protection layer on the active mesa and the lower contact layer to form electrodes there.

Stripping the patterned photoresist 85, the process removes the protection layer 79 in a portion on the active mesa 73 and a portion 5S of the lower contact layer 5 are etched by the RIE etching as shown in FIGS. 17A and 173. The burying region 81 left on portions except for the region 5S of the lower contact layer 5 plays role of the etching mask.

The process next removes the cap layer 55 on the active mesa 73 to exposed the upper contact layer 19 therein. In this process, it is preferable that the etching rate for the cap layer 55 is greater than the rate for the lower contact layer 5 to suppress the decrease of a thickness of the lower contact layer 5S. A wet etching using a mixture of HCl and CH₃COOH may show such a condition to enhance the etching rate of the cap layer 55. Because the cap layer 55 is made of material different from a material of the burying region 81, the cap layer 55 may have the etching rate greater than that of the burying region 81. Then, even the cap layer 55 is formed in thick; the burying region 81 may play a role of the etching mask when the cap layer 55 is etched.

The process next forms a cathode electrode 91 to be in contact with the upper contact layer in the active mesa 73, and an anode electrode 93 in the portion 5S of the lower contact layer 5 to complete the process of the PD 100 with the waveguide structure, as shown in FIG. 19.

An operation of the PD 100 with the waveguide structure will be described. Entering light/photons from the waveguide region 41, or another waveguide region 51, the light propagating in the waveguide region 41/51 enters the absorption layer 11 and causes pairs of electrons and holes, whose number depends on the magnitude of light entering the waveguide region, 41 or 51. Biasing between the cathode and anode to cause a reverse bias in the pin structure 21, the holes generated therein move to the anode 93 via the lower contact layer 5, while, the electrons move to the cathode 91 via the upper cladding layer 19, which results in a photocurrent flowing in an external apparatus. The magnitude of the light entering the PD 100 may be estimated by detecting the photocurrent.

The first and second intermediate layers, 7 and 9, make the top of the valence band lowering in stepwise form the absorption layer 11 to the lower contact layer 5, which may enhance the movement of the holes generated in the absorption layer 11 to the lower contact layer 5 compared with a structure without any intermediate layers. Then the operable frequency range of the PD 100 with the waveguide structure may be enhanced.

Moreover, the PD 100 according to an embodiment chooses materials for the lower contact layer 5 and the first intermediate layer 7 such that the valence band offset E5V becomes smaller than the conduction band offset E5C. Then, the holes generated in the absorption layer 11 are accelerated to move the lower contact layer 5.

Still further, the third and fourth intermediate layers, 13 and 14, make the bottom of the conduction band rising in stepwise from the absorption layer 11 to the cladding layer 17, which may enhance the movement of electrons generated in the absorption layer 11 to the upper contact layer 19 compared with a structure without third and fourth intermediate layers, 13 and 15. Thus, the operable frequency range may be widened.

Although the present invention is thus described as referring to exemplary embodiment, the invention may have variety of embodiments modified from those described. For instance, the embodiment described provides a process to form the cap layer after the formation of the waveguide region but before the formation of the second mask. However, the process may omit the formation of the cap layer.

The stack 23 of the embodiment described above provides the second intermediate layer 9, the second intermediate layer may be omitted. Even in such an arrangement without the second intermediate layer, the top of the valence band falls in stepwise from the absorption layer 11 to the lower contact layer 5, and the holes generated in the absorption layer 11 may be enhanced to move the lower contact layer 5 compared with an arrangement without any intermediate layers.

Thus, the present embodiments of the invention should be considered in all respects as illustrative and not restrictive, the scope of the invention to be determined by the appended claims and their equivalents.

I claim:

1. A method to manufacture a photodiode with a waveguide structure, comprising steps of:
   preparing a pin structure by growing, on a primary surface of a semiconductor substrate, a p-type contact layer, an i-type absorption layer, an n-type cladding layer;
   etching a portion of the pin structure to form a mesa stripe extending along a first direction;
   burying the mesa stripe by a waveguide region including a lower cladding region, a core region, and an upper cladding region selectively grown on the primary surface of the substrate exposed by the etching, the lower cladding region abutting against a side of the p-type contact layer, the core region abutting against a side of the i-type absorption layer, the upper cladding region abutting against a side of the n-type cladding layer;
   etching a portion of the lower cladding region, the core region, and the upper cladding region concurrently with an etching of the i-type absorption layer, and the n-type cladding layer by the p-type contact layer as an etching stopper layer to form a waveguide mesa in the waveguide region and an active mesa in the pin structure, the waveguide mesa extending along a second direction substantially in perpendicular to the first direction, the active mesa including the p-type contact layer, the i-type absorption layer, and the n-type cladding layer; and
   forming an electrode on the active mesa and another electrode on the p-type contact layer,
   wherein the p-type contact layer contains aluminum (Al).

2. The method of claim 1,
   wherein the p-type contact layer is made of compound semiconductor material with an Al composition thereof between 50 to 70%.

3. The method of claim 1,
   wherein the i-type absorption layer, the n-type cladding layer each contained in the active mesa, and the lower cladding layer, the core region, and the upper cladding layer in the waveguide mesa are free from Al.

4. The method of claim 1,
   wherein the i-type absorption layer, the n-type cladding layer each contained in the active mesa, and the lower cladding layer, the core region, and the upper cladding layer in the waveguide mesa contain Al with compositions thereof less than a composition of Al in the lower contact layer.

5. The method of claim 1,
   wherein the step to prepare the pin structure further includes a step to grow at least one intermediate layer between the p-type contact layer and the i-type absorption layer, and between the absorption layer and the n-type cladding layer,
   wherein the pin structure has a bandgap diagram in a bottom of a conduction band thereof rises in stepwise from the i-type absorption layer to the n-type cladding layer, and in a top of a valence band thereof falls in stepwise from the i-type absorption layer to the p-type contact layer.

6. The method of claim 1,
   wherein the first etching to form the active mesa and the second etching to form the waveguide mesa are carried out by an inductive coupled plasma (ICP) etching.

7. The method of claim 1,
   further including steps of, after the formation of the waveguide mesa but before the formation of the electrodes, burying the waveguide mesa and the active mesa by a resin of benzo-cycro-butanes (BCB), and etching the BCB to form via holes each reaching the top of the active mesa and the top of the p-type contact layer.

8. The method of claim 1,
wherein the step to prepare the pin structure includes to prepare a semi-insulating semiconductor substrate, to grow a p-type AlInAs for the p-type contact layer, to grow an i-type GaInAs for the i-type absorption layer, and to grow an n-type InP for the n-type cladding layer sequentially on the semi-insulating semiconductor substrate.

* * * * *